(12) United States Patent
Suzuki et al.

(10) Patent No.: US 12,265,129 B2
(45) Date of Patent: Apr. 1, 2025

(54) BATTERY MONITORING APPARATUS AND IDENTIFICATION INFORMATION GIVING METHOD

(71) Applicant: Hitachi Astemo, Ltd., Hitachinaka (JP)

(72) Inventors: Jun Suzuki, Hitachinaka (JP); Tsuyoshi Takaku, Hitachinaka (JP); Koichi Takahashi, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 335 days.

(21) Appl. No.: 17/865,569

(22) Filed: Jul. 15, 2022

(65) Prior Publication Data

US 2023/0088301 A1  Mar. 23, 2023

(30) Foreign Application Priority Data

Sep. 17, 2021  (JP) .................................. 2021-152066

(51) Int. Cl.
| | |
|---|---|
| *G01R 31/371* | (2019.01) |
| *B60L 58/10* | (2019.01) |
| *H01M 10/42* | (2006.01) |
| *H04B 17/318* | (2015.01) |

(52) U.S. Cl.
CPC ............ *G01R 31/371* (2019.01); *B60L 58/10* (2019.02); *H01M 10/425* (2013.01); *H01M 2010/4278* (2013.01); *H04B 17/318* (2015.01)

(58) Field of Classification Search
None
See application file for complete search history.

(56) References Cited

U.S. PATENT DOCUMENTS

| | | | | |
|---|---|---|---|---|
| 2007/0232255 | A1* | 10/2007 | Masuda ................. | H04B 1/385 455/343.1 |
| 2014/0379285 | A1* | 12/2014 | Dempsey ............. | G01R 31/371 702/63 |
| 2015/0346933 | A1* | 12/2015 | Vyas ........................ | G06F 1/28 715/772 |
| 2018/0259652 | A1* | 9/2018 | Shimizu .................... | G06T 7/70 |
| 2019/0260097 | A1 | 8/2019 | Kwon et al. | |

FOREIGN PATENT DOCUMENTS

JP          2020501481 A       1/2020

\* cited by examiner

*Primary Examiner* — Roy Y Yi
(74) *Attorney, Agent, or Firm* — CANTOR COLBURN LLP

(57) ABSTRACT

A battery monitoring apparatus includes: battery state detection devices configured to detect states of battery modules: a control device wirelessly connected to a plurality of the battery state detection devices to manage the states of the battery modules; and a processing unit configured to give, to the battery state detection devices to which identification information is to be given, an identification information indicating arrangement positions of the battery state detection devices based on a plurality of wireless communication strengths among wireless communication strengths between the battery state detection devices to which the identification information is to be given and other battery state detection devices, and wireless communication strengths between the battery state detection devices to which the identification information is to be given and the control device.

7 Claims, 5 Drawing Sheets

| IDENTIFICATION NUMBER | WIRELESS COMMUNICATION STRENGTH(dBm) | | | | | |
|---|---|---|---|---|---|---|
| | MONITORING DEVICE | OTHER VOLTAGE DETECTION DEVICE (IN ORDER OF STRENGTH) | | | | |
| 1 | ×× | ×× | ×× | ··· | ×× | ×× |
| 2 | ×× | ×× | ×× | ··· | ×× | ×× |
| 3 | ×× | ×× | ×× | ··· | ×× | ×× |
| 4 | ×× | ×× | ×× | ··· | ×× | ×× |

BATTERY MONITORING APPARATUS AND IDENTIFICATION INFORMATION GIVING METHOD

CROSS REFERENCES TO RELATED APPLICATIONS

The present invention claims priority under 35 U.S.C. § 119 to Japanese Application No. 2021-152066, filed on Sep. 17, 2021, the entire contents of which being incorporated herein by reference.

BACKGROUND

Field of the Invention

The present invention relates to a battery monitoring apparatus and an identification information giving method.

Description of Related Art

For example, Published Japanese Translation No. 2020-501481 of the PCT International Publication discloses a wireless battery management system in which a main BMS and a plurality of slave BMSs are wirelessly connected.

In such a wireless battery management system in which the main BMS and the plurality of slave BMSs are wirelessly connected, identification information indicating an arrangement position needs to be given to each of the slave BMSs. In Published Japanese Translation No. 2020-501481 of the PCT International Publication, the main BMS includes two master antennas. In Published Japanese Translation No. 2020-501481 of the PCT International Publication, the identification information is given to the slave BMSs on the basis of communication using these master antennas.

In a battery monitoring apparatus that wirelessly connects a control device such as the main BMS and battery state detection devices such as the slave BMSs, it is conceivable to specify the positions of the battery state detection devices and give an identification number on the basis of reception strengths between the control device and the battery state detection devices. However, generally, a plurality of battery state detection devices are arranged adjacent to each other. Therefore, the reception strengths between the control device and the battery state detection devices indicate the same value in all battery monitoring apparatuses, and it is difficult to perform position determination with high accuracy. It is conceivable to improve accuracy by using two antennas as disclosed in Published Japanese Translation No. 2020-501481 of the PCT International Publication; however, it would cause complexity of the device due to a plurality of antennas and an increase in cost.

The present invention was made in view of the problems described above, and an object thereof is to improve the accuracy of specifying positions of battery state detection devices without installing a plurality of transmission/reception units in the control device and the battery state detection devices in a battery monitoring apparatus in which a control device and the battery state detection devices can communicate wirelessly.

SUMMARY

The present invention adopts the following configurations as measures for solving the above problems.

A first aspect of the present invention is a battery monitoring apparatus including: battery state detection devices configured to detect states of battery modules: a control device wirelessly connected to a plurality of the battery state detection devices to manage the states of the battery modules; and a processing unit configured to give, to the battery state detection devices to which identification information is to be given, an identification information indicating arrangement positions of the battery state detection devices based on a plurality of wireless communication strengths among wireless communication strengths between the battery state detection devices to which the identification information is to be given and other battery state detection devices, and wireless communication strengths between the battery state detection devices to which the identification information is to be given and the control device.

A second aspect of the present invention adopts, in the first aspect, a configuration in which: the control device searches for the battery state detection devices, which are wirelessly connectable, based on an unique information stored in each of the battery state detection devices, and transmits a transmission instruction signal of a reception strength determination signal to the found battery state detection devices; the battery state detection devices transmit the reception strength determination signal to other battery state detection devices based on the transmission instruction signal; and the processing unit obtains wireless communication strengths between the battery state detection devices to which identification information is to be given and the control device based on a reception strength of the transmission instruction signal, obtains wireless communication strengths between the battery state detection devices to which identification information is to be given and the other battery state detection devices based on the reception strength of the reception strength determination signal, and gives the identification information to the battery state detection devices to which identification information is to be given based on the obtained wireless communication strengths.

A third aspect of the present invention adopts, in the first or second aspect, a configuration in which the processing unit is provided in each of the battery state detection devices.

A fourth aspect of the present invention adopts, in the third aspect, a configuration in which: the processing unit transmits the identification information to the control device with respect to the battery state detection devices to which identification information is to be given; and the control device stores the identification information.

A fifth aspect of the present invention adopts, in any one of the first to fourth aspects, a configuration in which a storage unit is provided to store a table indicating a relationship between the wireless communication strengths and the identification information, and the processing unit determines the identification information, which is to be given to the battery state detection devices to which identification information is to be given, based on the table.

A sixth aspect of the present invention is an identification information giving method of detecting states of battery modules and giving an identification information to battery state detection devices wirelessly connectable to a control device, the identification information giving method including: giving, to the battery state detection devices to which the identification information is to be given, the identification information indicating arrangement positions of the battery state detection devices based on a plurality of wireless communication strengths among wireless communication strengths between the battery state detection devices to which the identification information is to be given and other battery state detection devices, and wireless communication strengths between the battery state detection devices to which the identification information is to be given and the control device.

According to each of the aforementioned aspects of the present invention, the identification information is given to the battery state detection devices by using the plurality of wireless communication strengths among the wireless communication strengths between the battery state detection devices to which the identification information is to be given and the control device, and the wireless communication strengths between the battery state detection devices to which the identification information is to be given and the other battery state detection devices. The control device and each of the battery state detection devices include a single transmission/reception unit, which makes it possible to acquire wireless communication strengths. Consequently, according to the aforementioned each aspect of the present invention, even though a plurality of transmission/reception units are not installed in the control device and the battery state detection devices, a plurality of wireless communication strengths can be acquired. Furthermore, since the positions of the battery state detection devices can be specified by using the plurality of wireless communication strengths, the positions of the battery state detection devices can be specified with higher accuracy than when the positions of the battery state detection devices are specified only by the wireless communication strengths between the battery state detection devices to which the identification information is to be given and the control device. Thus, according to the aforementioned each aspect of the present invention, in a battery monitoring apparatus in which the control device and the battery state detection devices can communicate wirelessly, even though a plurality of transmission/reception units are not installed in the control device and the battery state detection devices, the accuracy of specifying the positions of the battery state detection devices can be improved.

DESCRIPTION OF EMBODIMENTS

Hereinafter, an embodiment of a battery monitoring apparatus and an identification information giving method according to the present invention will be described with reference to the drawings.

Figure 1:
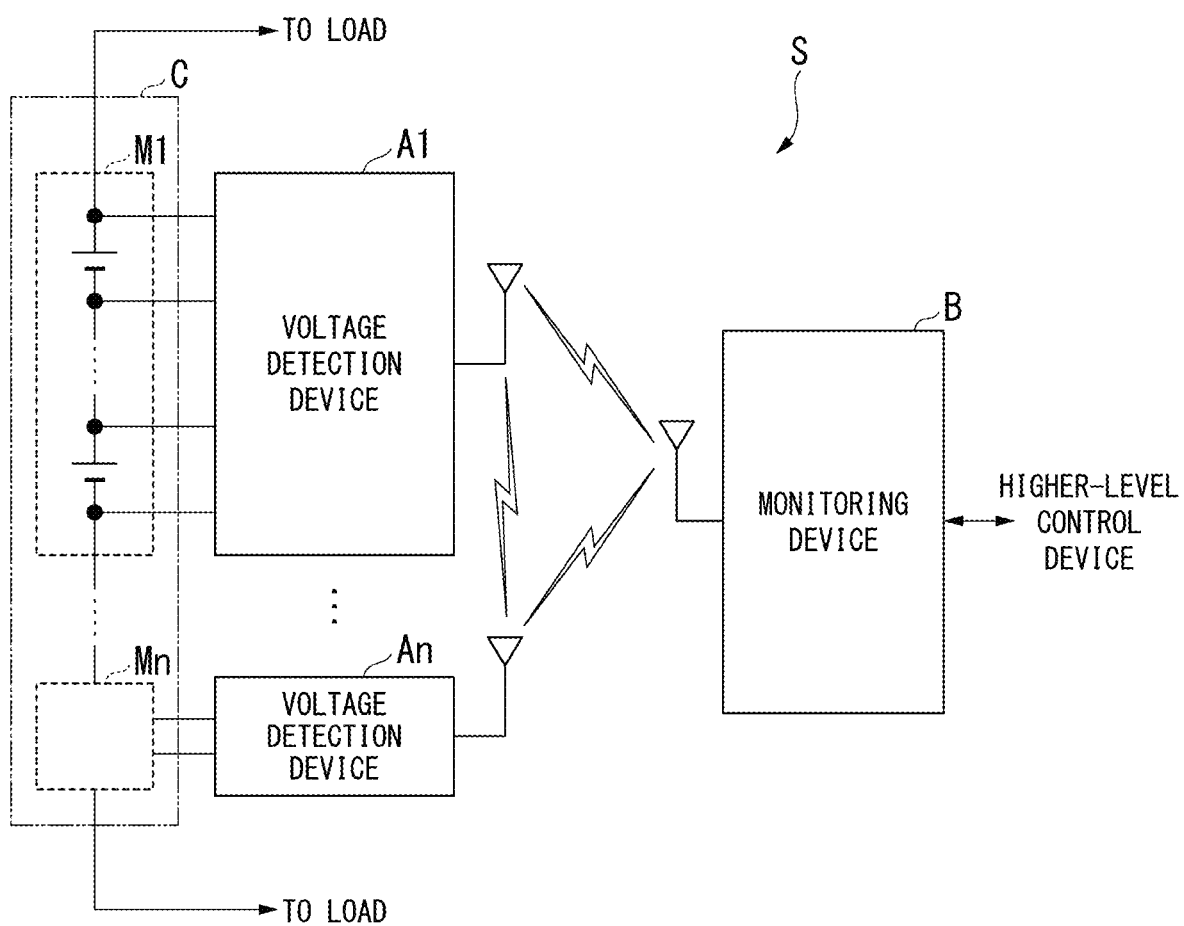
FIG. 1 is a block diagram showing a schematic configuration of a battery monitoring system in an embodiment of the present invention.

FIG. 1 is a block diagram showing a schematic configuration of a battery monitoring system S (battery monitoring apparatus) of the present embodiment. The battery monitoring system S of the present embodiment is mounted on, for example, a vehicle such as an electric vehicle or a hybrid vehicle. The battery monitoring system S of the present embodiment monitors a voltage and the like of a battery (battery pack C to be described below) mounted on a vehicle such as an electric vehicle or a hybrid vehicle. The battery is, for example, a battery for driving a vehicle such as an electric vehicle or a hybrid vehicle and is a secondary battery such as a lithium-ion battery or a nickel-hydride battery.

As shown in FIG. 1, the battery monitoring system S of the present embodiment includes a plurality of voltage detection devices A1 to An (battery state detection device) and a single monitoring device B (control device). These voltage detection devices A1 to An and monitoring device B are wirelessly connected to each other by a predetermined wireless channel so as to wirelessly communicate with each other. In the present embodiment, "n" is a subscript indicating an arbitrary natural number.

A monitoring target of such a battery monitoring system S is the battery pack C including n battery modules M1 to Mn. The n battery modules M1 to Mn include a plurality of battery cells connected in series and use the total voltage of the respective battery cells as an output voltage. Such n battery modules M1 to Mn are connected in series. That is, the battery pack C to be monitored in the present embodiment is a secondary battery that uses the total voltage of the n battery modules M1 to Mn as an output voltage.

The battery pack C in the present embodiment is mounted on an electrically driven vehicle such as an electric vehicle or a hybrid vehicle, and supplies DC power to, for example, a traveling motor (load) that is a traveling power source. As such a battery pack C, a fuel cell can also be used in addition to the aforementioned lithium-ion battery or nickel-hydrogen battery. The battery pack C outputs, for example, an output voltage of several hundred volts.

A plurality of n voltage detection devices A1 to An are provided corresponding to the n battery modules M1 to Mn. That is, the plurality of n voltage detection devices A1 to An are provided corresponding to the battery modules M1 to Mn. The voltage detection devices A1 to An detect voltages (voltages of respective cells) of the battery modules M1 to Mn respectively corresponding to the voltage detection devices A1 to An, and wirelessly transmit the voltage detection values (voltage information) to the monitoring device B together with their own identification information (ID), for example.

The monitoring device B monitors the state of the battery pack C on the basis of the cell voltage detection values of the respective battery modules M1 to Mn wirelessly received from the respective voltage detection devices A1 to An. The monitoring device B sequentially reports the monitoring result of the battery pack C to a higher-level control device (not illustrated).

Such voltage detection devices A1 to An and monitoring device B will be described in more detail with reference to FIG. 2. The n voltage detection devices A1 to An are given individual identification information (ID) for specifying their own arrangement positions, but have the same basic configuration. Consequently, hereinafter, a detailed configuration of the voltage detection device A1 will be representatively described.

Figure 2:
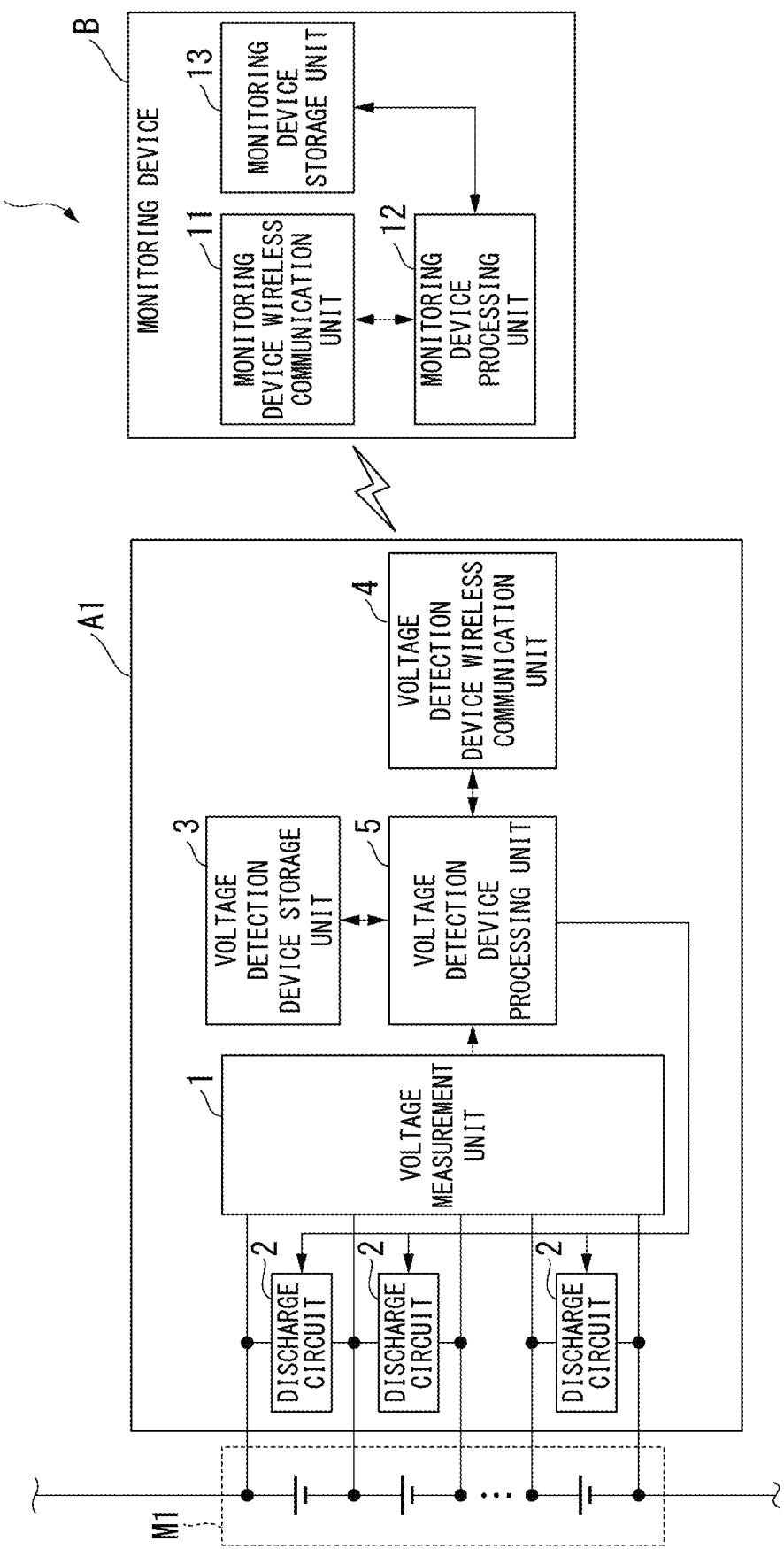
FIG. 2 is a block diagram showing a voltage detection device and a monitoring device included in the battery monitoring system in an embodiment of the present invention.

FIG. 2 is a block diagram showing the voltage detection device A1 and the monitoring device B included in the battery monitoring system S in the present embodiment. As shown in FIG. 2, the voltage detection device A1 includes a voltage measurement unit 1, a plurality of discharge circuits 2, a voltage detection device storage unit 3, a voltage detection device wireless communication unit 4, and a voltage detection device processing unit 5.

The voltage measurement unit 1 detects output voltages (cell voltages) of m battery cells constituting the battery module M1, and outputs the detection values of the m cell voltages (cell voltage detection values) to a voltage detection device processing unit 5. In the present embodiment, "m" is a subscript indicating an arbitrary natural number. As shown in the FIG. 2, electrodes (positive and negative electrodes) of respective battery cells in the battery module M1 are connected to a plurality of input terminals of the voltage measurement unit 1, respectively, and the voltage measurement unit 1 acquires the cell voltage detection values on the basis of a difference between the potential of the plus electrode and the potential of the minus electrode of each of the battery cells.

The voltage measurement unit 1 detects the cell voltage, which is an analog value, by sampling the potential of the plus electrode and the potential of the minus electrode of each of the battery cells at a predetermined time interval. Furthermore, the voltage measurement unit 1 sequentially outputs the cell voltage detection values to the voltage detection device processing unit 5.

As described above, the n battery modules M1 to Mn are secondary batteries and can be charged and discharged. Each of the plurality of discharge circuits 2 is a series circuit of an electronic switch and a resistor provided for each battery cell in order to equalize the charge states of the m battery cells in the battery module M1.

Each of the discharge circuits 2 includes an electronic switch such as a switching transistor whose on state and off state are managed by the voltage detection device processing unit 5, and a resistor connected in series to the electronic switch and having a predetermined resistance value. The on state and the off state of the electronic switch of the discharge circuit 2 corresponding to each battery cell are switched between by the voltage detection device processing unit 5. When the electronic switch of the discharge circuit 2 is turned on, power of the battery cell is discharged.

The voltage detection device storage unit 3 is, for example, a rewritable nonvolatile memory or the like. The voltage detection device storage unit 3 stores the cell voltages measured by the voltage measurement unit 1, and programs, parameters, and the like required for a process (for example, an identification information giving process to be described below) of the voltage detection device processing unit 5. Furthermore, the voltage detection device storage unit 3 stores unique information such as a serial number of the voltage detection device A1 (that is, the battery module M1).

Furthermore, the voltage detection device storage unit 3 in the present embodiment stores an identification information giving table indicating the relationship between wireless communication strengths and identification information. The identification information in the present embodiment is information indicating installation positions of the voltage detection devices A1 to An. One of the voltage detection devices A1 to An is connected to one of the battery modules M1 to Mn, and is packaged with one of the battery modules M1 to Mn. That is, the voltage detection device A1 and the battery module M1 are packaged. That is, the identification information is also information indicating installation positions of the battery modules M1 to Mn.

For example, the battery modules M1 to Mn are accommodated in a case together with the monitoring device B and a power converter (not illustrated) and packaged as a battery package. The case is provided therein with a plurality of installation units for installing the battery modules M1 to Mn, and each of the battery modules M1 to Mn is attached to one of the installation units in a predetermined posture. Different identification information is set for each of the installation units, and the installation positions of the voltage detection devices A1 to An (the battery modules M1 to Mn) can be specified on the basis of the identification information.

Figures 3, 4:
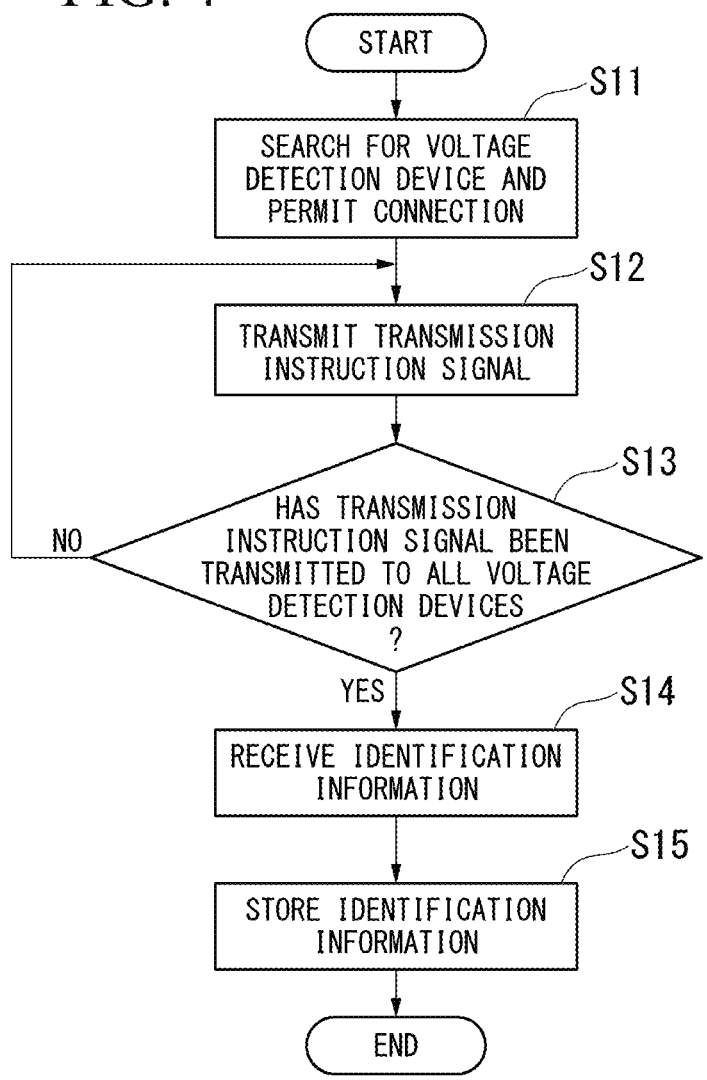
FIG. 3 is a conceptual diagram of an identification information giving table.
FIG. 4 is a flowchart for explaining an operation of the monitoring device included in the battery monitoring system in an embodiment of the present invention.

The identification information giving table is a table in which wireless communication strengths between the voltage detection devices A1 to An and the monitoring device B and wireless communication strengths between the voltage detection devices A1 to An are correlated with each other for each piece of identification information. In FIG. 3, "xx" indicates that specific numbers are omitted. For example, as shown in FIG. 3, identification numbers 1 to 4 are set as the identification information. In such a case, wireless communication strengths between the voltage detection devices A1 to An installed at positions indicated by the identification number 1 and the monitoring device B are correlated with the identification number 1. Furthermore, wireless communication strengths between the voltage detection devices A1 to An installed at the positions indicated by the identification number 1 and other voltage detection devices A1 to An are correlated with the identification number 1. As these wireless communication strengths, values obtained in advance by experiments or simulations can be used. The wireless communication strengths may indicate detected values as they are or relative values with respect to some standards.

Similarly, wireless communication strengths between the voltage detection devices A1 to An installed at positions indicated by the identification number 2 and the monitoring device B are correlated with the identification number 2. Furthermore, wireless communication strengths between the voltage detection devices A1 to An installed at the positions indicated by the identification number 2 and other voltage detection devices A1 to An are correlated with the identification number 2.

Similarly, wireless communication strengths between the voltage detection devices A1 to An installed at positions indicated by the identification number 3 and the monitoring device B are correlated with the identification number 3. Furthermore, wireless communication strengths between the voltage detection devices A1 to An installed at the positions indicated by the identification number 3 and other voltage detection devices A1 to An are correlated with the identification number 3.

Similarly, wireless communication strengths between the voltage detection devices A1 to An installed at positions indicated by the identification number 4 and the monitoring device B are correlated with the identification number 4. Furthermore, wireless communication strengths between the voltage detection devices A1 to An installed at the positions indicated by the identification number 4 and other voltage detection devices A1 to An are correlated with the identification number 4.

As many wireless communication strengths exist (hereinafter, wireless communication strengths between voltage detection devices) between the voltage detection devices A1 to An arranged at positions indicated by certain identification information and other voltage detection devices A1 to An as the number of the other voltage detection devices A1 to An. In the present embodiment, in the identification information giving table, a plurality of wireless communication strengths between voltage detection devices are correlated with certain identification information and are arranged and correlated in the order of communication strength.

In the present embodiment, such an identification information giving table is stored in the voltage detection device storage unit 3 of each of the voltage detection devices A1 to An. The identification information giving tables stored in the voltage detection device storage units 3 of these voltage detection devices A1 to An are the same.

Referring now back to FIG. 2, the voltage detection device wireless communication unit 4 transmits/receives information by performing wireless communication with the monitoring device B. The voltage detection device wireless communication unit 4 receives information obtained by wireless communication from the monitoring device B and outputs the received information to the voltage detection device processing unit 5 or transmits information from the voltage detection device processing unit 5 to the monitoring device B by wireless communication. The communication method of the wireless communication is not particularly limited as long as it is wireless. Furthermore, in the present embodiment, the voltage detection device wireless communication unit 4 transmits/receives information by performing wireless communication with voltage detection device wireless communication units 4 of other voltage detection devices (voltage detection devices A2 to An in the case of the voltage detection device A1).

The voltage detection device processing unit 5 performs cell balance control by controlling the discharge circuit 2 on the basis of the plurality of cell voltages acquired from the voltage measurement unit 1. Furthermore, the voltage detection device processing unit 5 transmits information (hereinafter, referred to as "management information") required for stably operating the battery module M1 to the monitoring device B by wireless communication. The management information is, for example, information indicating a plurality of cell voltages, the highest cell voltage, the lowest cell voltage, and the like.

Such a voltage detection device A1 may include a processor such as a central processing unit (CPU) or a micro processing unit (MPU). Furthermore, the voltage detection device processing unit 5 may include a nonvolatile or volatile semiconductor memory (for example, a random access memory (RAM), a read only memory (ROM), a flash memory, an erasable programmable read only memory (EPROM), or an electrically erasable programmable read only memory (EEPROM). For example, the voltage detection device processing unit 5 may be a microcontroller such as a micro controller unit (MCU).

As shown in FIG. 1, the monitoring device B transmits/receives information by performing wireless communication with each of the plurality of voltage detection devices A1 to An, and manages the plurality of battery modules M1 to Mn. The monitoring device B communicates with each of the plurality of voltage detection devices A1 to An and receives the management information of each of the battery modules M1 to Mn. The monitoring device B ascertains the state of each of the battery modules M1 to Mn on the basis of the management information. For example, the monitoring device B is a battery management unit (BMU).

The monitoring device B may include a processor such as a CPU or an MPU. Furthermore, the monitoring device B may include a nonvolatile or volatile semiconductor memory (for example, a RAM, a ROM, a flash memory, an EPROM, or an EEPROM). For example, the monitoring device B may be a microcontroller such as an MCU. As shown in FIG. 2, the monitoring device B includes a monitoring device wireless communication unit 11, a monitoring device processing unit 12, and a monitoring device storage unit 13.

The monitoring device wireless communication unit 11 transmits/receives information by performing wireless communication with the voltage detection device wireless communication units 4 of the voltage detection devices A1 to An. The monitoring device wireless communication unit 11 receives information obtained by wireless communication from the voltage detection device wireless communication units 4 of the voltage detection devices A1 to An and outputs the received information to the monitoring device processing unit 12 or transmits information from the monitoring device processing unit 12 to the voltage detection device wireless communication units 4 by wireless communication.

For example, the monitoring device processing unit 12 acquires the management information obtained from the voltage detection devices A1 to An by wireless communication. For example, on the basis of the management information obtained from the voltage detection devices A1 to An, the monitoring device processing unit 12 determines whether the respective battery modules M1 to Mn are normal.

Furthermore, in the present embodiment, when the battery monitoring system S of the present embodiment is assembled, the monitoring device processing unit 12 instructs to start the identification information giving process of correlating the respective voltage detection devices A1 to An with the identification information indicating the arrangement positions of the battery modules M1 to Mn. In the present embodiment, when the identification information giving process is started, the respective voltage detection devices A1 to An give identification information to themselves. The monitoring device processing unit 12 correlates the identification information given by the respective voltage detection devices A1 to An with identification information (ID) set for each arrangement position of the battery module M on a one-to-one basis, generates an identification information allocation table indicating the correspondence relationship between the respective voltage detection devices A1 to An and the identification information, and stores the generated identification information allocation table in the monitoring device storage unit 13.

When the identification information allocation table is stored in the monitoring device storage unit 13, the monitoring device processing unit 12 performs subsequent processing on the basis of the identification information allocation table. That is, the identification information giving process is performed only once immediately after the battery monitoring system S is assembled. However, at the time of maintenance, on the basis of an instruction of an operator or the like, the identification information giving process may be performed again and the identification information allocation table may be updated.

The monitoring device storage unit 13 is a rewritable nonvolatile memory or the like. The monitoring device storage unit 13 stores, for example, programs or parameters for causing the monitoring device processing unit 12 to start the identification information giving process.

Subsequently, the identification information giving process (identification information giving method) in the battery monitoring system S of the present embodiment will be described with reference to FIG. 4 to FIG. 6.

FIG. 4 is a flowchart for explaining an operation of the monitoring device B in the identification information giving process. FIG. 5 is a flowchart for explaining an operation of the voltage detection device A1 having received a start instruction in the identification information giving process. FIG. 6 is a flowchart for explaining an operation of the voltage detection device A1 when identification information is determined and given in the identification information giving process. Since the operations of the respective voltage detection devices A1 to An are the same in the identification information giving process, the operation of the voltage detection device A1 will be described in the description based on FIG. 5 and FIG. 6.

The identification information giving process is a process performed before monitoring and management of the battery pack C are started after the battery monitoring system S is assembled. The identification information giving process is a process of giving identification information for specifying arrangement positions to the respective battery modules M1 to Mn. For example, when n installation units for installing the battery modules M1 to Mn are provided inside the case of the battery package, the identification information is information indicating whether which of the battery modules M1 to Mn is installed in which of the installation units. The identification information is given to the respective battery modules M1 to Mn, which makes it possible to perform the monitoring and management of the battery pack C.

The identification information giving process is started in the state in which the battery modules M1 to Mn are attached to the above installation units. As shown in FIG. 4, the monitoring device B searches for the voltage detection devices A1 to An and permits wireless connection to the respective voltage detection devices A1 to An (step S11). For example, the monitoring device processing unit 12 of the monitoring device B searches for the voltage detection devices A1 to An to which radio waves are emitted via the monitoring device wireless communication unit 11, and permits wireless connection when permission for wireless connection is requested by the voltage detection devices A1 to An from which radio waves are detected. Even though the monitoring device B is wirelessly connected to the voltage detection devices A1 to An at this time point, it is not possible to ascertain the arrangement positions of the battery modules M1 to Mn.

Subsequently, the monitoring device B transmits a transmission instruction signal of a reception strength determination signal to the wirelessly connected voltage detection devices A1 to An (step S12). The monitoring device B in the present embodiment selects any one of the wirelessly connected voltage detection devices A1 to An, to which the transmission instruction signal of the reception strength determination signal is not transmitted, from the wirelessly connected voltage detection devices A1 to An and transmits the transmission instruction signal of the reception strength determination signal to the selected voltage detection device. The monitoring device processing unit 12 of the monitoring device B outputs the transmission instruction signal toward the wirelessly connected voltage detection devices A1 to An via the monitoring device wireless communication unit 11.

For example, the monitoring device B acquires unique information (information including a serial number and the like) from all the wirelessly connected voltage detection devices A1 to An. On the basis of the unique information, the monitoring device B identifies the wirelessly connected voltage detection devices A1 to An. For example, in step S12, the monitoring device B selects the voltage detection devices A1 to An on the basis of the unique information.

Subsequently, the monitoring device B determines whether the transmission instruction signal has been transmitted to all the voltage detection devices A1 to An (step S13). When the transmission instruction signal has not been transmitted to all the voltage detection devices A1 to An, the monitoring device B performs step S12 again.

When it is determined in step S13 that the transmission instruction signal has been transmitted to all the voltage detection devices A1 to An, the monitoring device B receives identification information given to the respective voltage detection devices A1 to An from the respective voltage detection devices A1 to An (step S14). For example, the monitoring device B receives identification information given to the voltage detection device A1 from the voltage detection device A1.

Subsequently, the monitoring device B stores the identification information received from all the voltage detection devices A1 to An (step S15). Specifically, the monitoring device processing unit 12 stores the identification information received from the voltage detection devices A1 to An in the monitoring device storage unit 13 corresponding to the voltage detection devices A1 to An.

Figure 5:
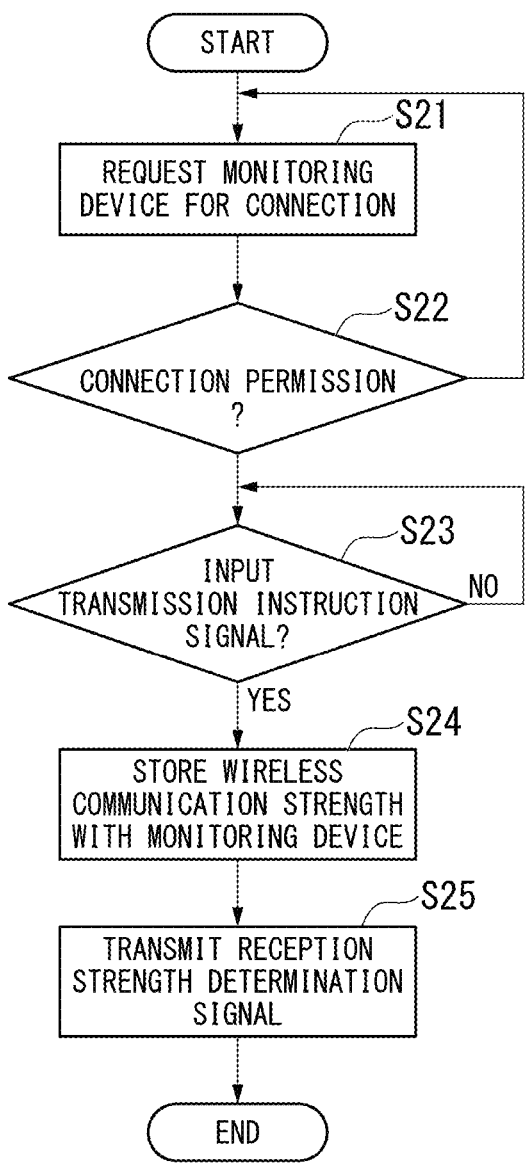
FIG. 5 is a flowchart for explaining an operation of the voltage detection device included in the battery monitoring system in an embodiment of the present invention.
Figure 6:
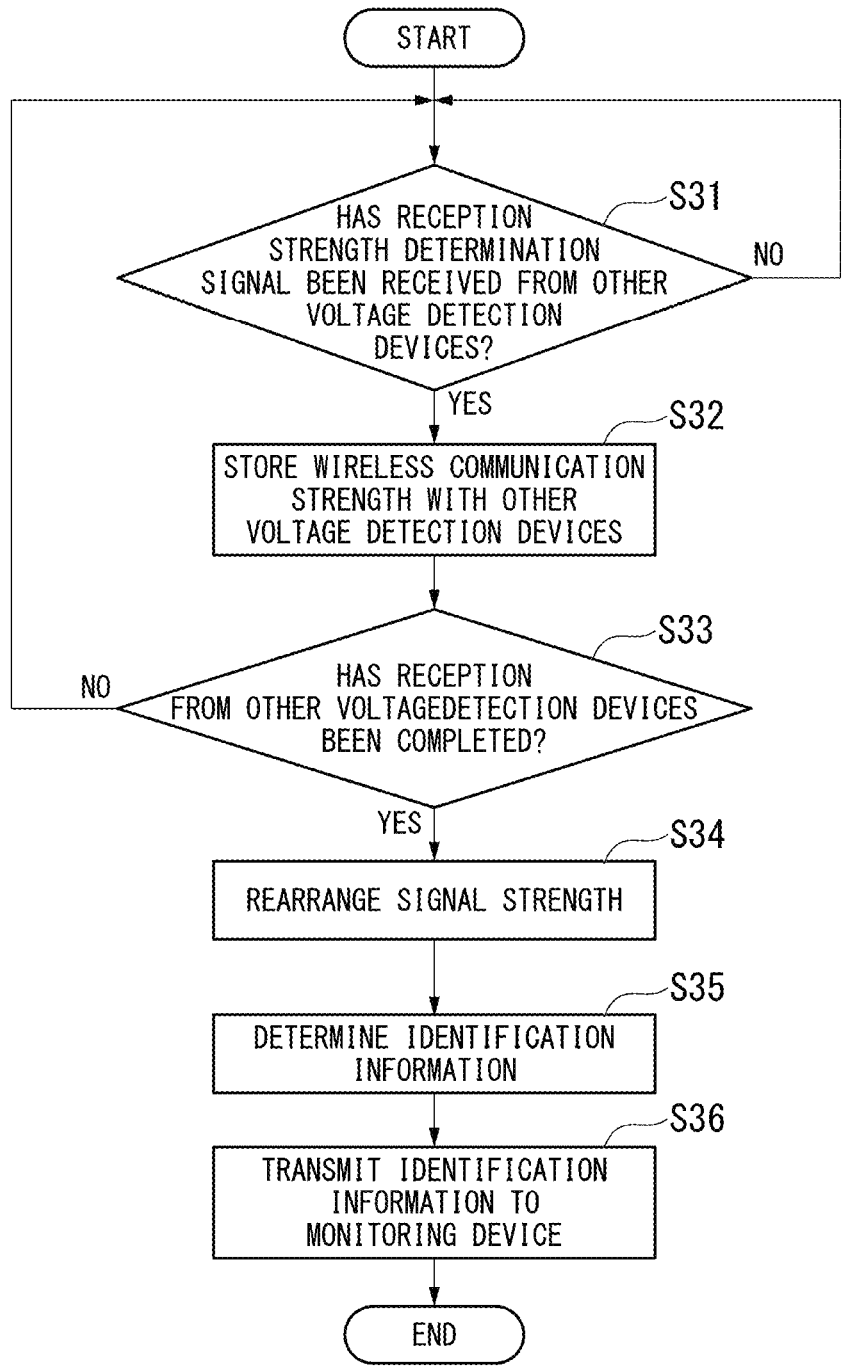
FIG. 6 is a flowchart for explaining an operation of the voltage detection device included in the battery monitoring system in an embodiment of the present invention.

On the other hand, as shown in FIG. 5, when the identification information giving process is started, the voltage detection device A1 requests the monitoring device B for permission for wireless connection (step S21). When it is determined that wireless connection is not permitted (step S22), the voltage detection device A1 returns to step S21 and repeatedly performs the connection permission.

When the wireless connection is permitted in step S21, the voltage detection device A1 determines whether a transmission instruction signal of a reception strength determination signal is input from the monitoring device B (step S23). When no transmission instruction signal is input, the voltage detection device A1 repeats step S23 and waits until the transmission instruction signal is input.

When the transmission instruction signal is input from the monitoring device B, the voltage detection device A1 stores the strength of the transmission instruction signal as the wireless communication strength with the monitoring device B (step S24). Specifically, the voltage detection device processing unit 5 obtains the wireless communication strength with the monitoring device B and stores the obtained wireless communication strength in the voltage detection device storage unit 3.

Subsequently, the voltage detection device A1 transmits the reception strength determination signal toward the other voltage detection devices A2 to An (step S25). Specifically, the voltage detection device processing unit 5 of the voltage detection device A1 transmits the reception strength determination signal via the voltage detection device wireless communication unit 4. The reception strength determination signal is a signal for the voltage detection devices A1 to An to determine the reception strength therebetween, and the strength when emitted from the voltage detection device wireless communication unit 4 is set to predetermined constant strength.

Furthermore, in the identification information giving process, as shown in FIG. 5, the voltage detection device A1 determines whether the reception strength determination signals have been received from the other voltage detection devices A2 to An (step S31). When the reception strength determination signals have not been received, the voltage detection device A1 repeats step S31 and waits until the reception strength determination signals are received.

When the reception strength determination signals are received, the voltage detection device A1 stores the strengths of the reception strength determination signals as wireless communication strengths with the other voltage detection devices A2 to An (step S32). Specifically, the voltage detection device processing unit 5 of the voltage detection device A1 obtains the wireless communication strengths with the other voltage detection devices A2 to An, and stores the obtained wireless communication strengths in the voltage detection device storage unit 3.

The voltage detection device A1 stores a wireless communication strength for each received reception strength determination signal. Therefore, for example, the reception strength determination signal is also given information that can be distinguished from other reception strength determination signals. Furthermore, timings of transmitting the reception strength determination signals from the voltage detection devices A1 to An are shifted in chronological order under the control of the monitoring device B, so that the reception strength determination signals can be identified. At this time, the voltage detection device A1 does not necessarily have to be able to specify from which voltage detection devices A2 to An the received reception strength determination signal is transmitted.

Subsequently, the voltage detection device A1 determines whether reception strength determination signals with all the other voltage detection devices A2 to An are received (step S33). When the reception strength determination signals with all the other voltage detection devices A2 to An are not received, the voltage detection device A1 returns to step S31 again. For example, the voltage detection device A1 stores the number of other voltage detection devices A2 to An in advance, and when the wireless communication strengths with the other voltage detection devices A2 to An are stored in the same number as that of other voltage detection devices A2 to An, the voltage detection device A1 determines that the reception strength determination signals with all the other voltage detection devices A2 to An are received.

When it is determined in step S33 that the reception strength determination signals with all the other voltage detection devices A2 to An are received, the voltage detection device A1 rearranges the wireless communication strengths with the other voltage detection devices A2 to An in the order of strength (step S34).

Subsequently, the voltage detection device A1 collates the wireless communication strengths with the other voltage detection devices A2 to An rearranged in step S34 and the wireless communication strength with the monitoring device B stored in step S22 with the identification information giving table stored in the voltage detection device storage unit 3, and determines identification information to be given to the voltage detection device A1 (step S35). Even when the wireless communication strengths with the other voltage detection devices A2 to An rearranged in step S34 are slightly different from values shown in the identification information giving table, the voltage detection device A1 regards this difference as an error and determines that the wireless communication strengths with the other voltage detection devices A2 to An match the values shown in the identification information giving table. Furthermore, even when the wireless communication strength with the monitoring device B stored in step S22 is slightly different from a value shown in the identification information giving table, the voltage detection device A1 regards this difference as an error and determines that the wireless communication strength with the monitoring device B match the value shown in the identification information giving table. The voltage detection device A1 stores the identification information determined in step S35 in the voltage detection device storage unit 3.

Subsequently, the voltage detection device A1 transmits the identification information given to itself and determined in step S35 to the monitoring device B (step S36). The identification information transmitted in step S36 is stored in the monitoring device B as described above.

The battery monitoring system S of the present embodiment as described above includes the voltage detection devices A1 to An and the monitoring device B. The voltage detection devices A1 to An detect the states of the battery modules M1 to Mn. The monitoring device B manages the states of the battery modules M1 to Mn wirelessly connected to a plurality of the voltage detection devices A1 to An. Furthermore, the battery monitoring system S of the present embodiment includes the voltage detection device processing unit 5. The voltage detection device processing unit 5 gives to the voltage detection devices A1 to An to which identification information is to be given, identification information indicating the arrangement positions of the voltage detection devices A1 to An. The voltage detection device processing unit 5 gives the identification information on the basis of wireless communication strengths between the voltage detection devices A1 to An to which identification information is to be given and other voltage detection devices A1 to An, and the wireless communication strengths between the voltage detection devices A1 to An to which identification information is to be given and the monitoring device B.

In the battery monitoring system S of the present embodiment, the monitoring device B and each of the voltage detection devices A1 to An include a single transmission/reception unit (the voltage detection device wireless communication units 4 in the voltage detection devices A1 to An and the monitoring device wireless communication unit 11 in the monitoring device B), which makes it possible to acquire wireless communication strengths. That is, according to the battery monitoring system S of the present embodiment, even though a plurality of transmission/reception units are not installed in the monitoring device B or the voltage detection devices A1 to An, wireless communication strengths with a plurality of locations can be acquired.

By specifying the positions of the voltage detection devices A1 to An by using wireless communication strengths at a plurality of locations, the positions of the voltage detection devices A1 to An can be specified with higher accuracy than when specifying the positions of the voltage detection devices A1 to An only by the wireless communication strengths between the voltage detection devices A1 to An to which identification information is to be given and the monitoring device B. Thus, according to the battery monitoring system S of the present embodiment, even though a plurality of transmission/reception units are not installed in the monitoring device B or the voltage detection devices A1 to An, the accuracy of specifying the positions of the voltage detection devices A1 to An can be improved.

Furthermore, in the battery monitoring system S of the present embodiment, when identification information is given to the voltage detection device A1, a plurality of wireless communication strengths between the voltage detection device A1 and the other voltage detection devices A2 to An are used. Distances from the monitoring device B to the voltage detection devices A1 to An are longer than those among the voltage detection devices A1 to An. Therefore, when the distances from the monitoring device B to the respective voltage detection devices A1 to An are compared, the difference when these distances are expressed as a ratio is small. On the other hand, the respective voltage detection devices A1 to An are arranged close to one another. Therefore, when the distances among the voltage detection devices A1 to An are compared, the difference when these distances are expressed as a ratio is large. Naturally, there is a correlation between these ratios and a ratio of the plurality of wireless communication strengths. Consequently, by using the plurality of wireless communication strengths among the voltage detection devices A1 to An having a large difference in ratio, the position of the voltage detection device A1 can be more accurately specified. That is, according to the battery monitoring system S of the present embodiment, the positions of the voltage detection devices A1 to An are specified by using the plurality of wireless communication strengths among the voltage detection devices A1 to An, so that the position of the voltage detection devices A1 to An can be accurately specified and identification numbers can be accurately given.

In the present embodiment, identification numbers are given by using wireless communication strengths between the voltage detection devices A1 to An to which identification information is to be given and all the other voltage detection devices A1 to An, and wireless communication strengths between the voltage detection devices A1 to An to which identification information is to be given and the monitoring device B. However, identification information can be given by using at least two of the wireless communication strengths between the voltage detection devices A1 to An to which identification information is to be given and all the other voltage detection devices A1 to An, and the wireless communication strengths between the voltage detection devices A1 to An to which identification information is to be given and the monitoring device B. However, the identification numbers are given by using the wireless communication strengths between the voltage detection devices A1 to An to which identification information is to be given and all the other voltage detection devices A1 to An, and the wireless communication strengths between the voltage detection devices A1 to An to which identification information is to be given and the monitoring device B, so that identification information can be given without selecting wireless communication strengths. Consequently, execution programs of the identification information giving processes of the voltage detection devices A1 to An can be commonalized.

Furthermore, in the battery monitoring system S of the present embodiment, for example, the monitoring device B searches for the voltage detection devices A1 to An, which can be wirelessly connected, on the basis of unique information stored in the respective voltage detection devices A1 to An. Furthermore, the monitoring device B transmits a transmission instruction signal of a reception strength determination signal to the found voltage detection devices A1 to An. The voltage detection devices A1 to An transmit the reception strength determination signal to other voltage detection devices A1 to An on the basis of the transmission instruction signal. The voltage detection device processing units 5 of the voltage detection devices A1 to An obtain wireless communication strengths between the voltage detection devices A1 to An to which identification information is to be given and other voltage detection devices A1 to An on the basis of the reception strength of the transmission instruction signal. Furthermore, on the basis of the reception strength of the transmission instruction signal, the voltage detection device processing units 5 obtain wireless communication strengths between the voltage detection devices A1 to An to which identification information is to be given and the monitoring device B. Moreover, on the basis of the obtained wireless communication strengths, the voltage detection device processing units 5 give identification information to the voltage detection devices A1 to An to which identification information is to be given.

In such a battery monitoring system S of the present embodiment, in the case of the monitoring device B, a transmission instruction signal of a reception strength determination signal is simply transmitted to the voltage detection device processing unit 5, so that the giving of identification information to all the voltage detection devices A1 to An is completed. Therefore, the processing load of the monitoring device B for giving identification information can be reduced.

Furthermore, in the battery monitoring system S of the present embodiment, the voltage detection device processing unit 5 is provided in each of the voltage detection devices A1 to An. According to such a battery monitoring system S of the present embodiment, identification information can be given to each of the voltage detection devices A1 to An on the basis of a transmission instruction signal. Therefore, the arithmetic process for giving identification information can be distributed to and performed by a plurality of the voltage detection device processing units 5. Consequently, identification information can be given in a short time without increasing the processing load of each of the voltage detection device processing units 5.

Furthermore, in the battery monitoring system S of the present embodiment, the voltage detection device processing unit 5 transmits identification information to the monitoring device B with respect to the voltage detection devices A1 to An to which identification information is to be given, and the monitoring device B stores the identification information. Therefore, the monitoring device B can perform control on the basis of the identification information given to the voltage detection devices A1 to An.

Furthermore, the battery monitoring system S of the present embodiment includes the voltage detection device storage unit 3 that stores the identification information giving table indicating the relationship between wireless communication strengths and identification information, and the voltage detection device processing unit 5 determines identification information to be given to the voltage detection devices A1 to An, to which identification information is to be given, on the basis of the identification information giving table. Therefore, identification information can be easily determined.

Furthermore, the identification information giving method of the present embodiment is a method of giving identification information to the voltage detection devices A1 to An that detect the states of the battery modules M1 to Mn. In the identification information giving method of the present embodiment, identification information indicating the arrangement positions of the voltage detection devices A1 to An is given to the voltage detection devices A1 to An, to which identification information is to be given, on the basis of a plurality of wireless communication strengths among wireless communication strengths between the voltage detection devices A1 to An to which identification information is to be given and other voltage detection devices A1 to An, and the wireless communication strengths between the voltage detection devices A1 to An to which identification information is to be given and the monitoring device B.

In such an identification information giving method of the present embodiment, the monitoring device B and each of the voltage detection devices A1 to An include a single transmission/reception unit (the voltage detection device wireless communication units 4 in the voltage detection devices A1 to An and the monitoring device wireless communication unit 11 in the monitoring device B), which makes it possible to acquire wireless communication strengths. That is, according to the identification information giving method of the present embodiment, even though a plurality of transmission/reception units are not installed in the monitoring device B or the voltage detection devices A1 to An, wireless communication strengths with a plurality of locations can be acquired. Thus, according to the identification information giving method of the present embodiment, even though a plurality of transmission/reception units are not installed in the monitoring device B or the voltage detection devices A1 to An, the accuracy of specifying the positions of the voltage detection devices A1 to An can be improved.

Although the preferred embodiment of the present invention has been described with reference to the accompanying drawings, it goes without saying that the present invention is not limited to the above embodiment. Various shapes, combinations, and the like of constituent members shown in the aforementioned embodiment are examples and can be variously changed on the basis of design requirements and the like without departing from the spirit of the present invention.

For example, in the above embodiment, the configuration in which each voltage detection device processing unit 5 gives identification information of the voltage detection devices A1 to An in which the voltage detection device processing unit 5 is installed has been described. However, the present invention is not limited thereto. For example, the present invention can also adopt a configuration in which the monitoring device processing unit 12 of the monitoring device B gives identification information of each of the voltage detection devices A1 to An. In such a case, the monitoring device processing unit 12 of the monitoring device B serves as a processing unit that gives identification information indicating the arrangement positions of the voltage detection devices A1 to An.

EXPLANATION OF REFERENCES

1 Voltage measurement unit
2 Discharge circuit
3 Voltage detection device storage unit (storage unit)
4 Voltage detection device wireless communication unit
5 Voltage detection device processing unit (processing unit)
11 Monitoring device wireless communication unit
12 Monitoring device processing unit
13 Monitoring device storage unit
A1 to An Voltage detection device (battery state detection device)
B Monitoring device (control device)
M1 to Mn Battery module
S battery monitoring system

What is claimed is:

1. A battery monitoring apparatus comprising:
   battery state detection devices configured to detect states of battery modules:
   a control device wirelessly connected to a plurality of the battery state detection devices to manage the states of the battery modules; and
   a processing unit configured to give, to the battery state detection devices to which identification information is to be given, an identification information indicating arrangement positions of the battery state detection devices based on a plurality of wireless communication strengths among wireless communication strengths between the battery state detection devices to which the identification information is to be given and other battery state detection devices, and wireless communication strengths between the battery state detection devices to which the identification information is to be given and the control device,
   wherein the control device:
     searches for the battery state detection devices, which are wirelessly connectable, based on a unique information stored in each of the battery state detection devices, and
     transmits a transmission instruction signal of a reception strength determination signal to the found battery state detection devices;
   the battery state detection devices transmit the reception strength determination signal to other battery state detection devices based on the transmission instruction signal; and
   the processing unit
     obtains wireless communication strengths between the battery state detection devices to which identification information is to be given and the control device based on a reception strength of the transmission instruction signal,
     obtains wireless communication strengths between the battery state detection devices to which identification information is to be given and the other battery state detection devices based on the reception strength of the reception strength determination signal, and
     gives the identification information to the battery state detection devices to which identification information is to be given based on the obtained wireless communication strengths.

2. The battery monitoring apparatus according to claim 1, wherein the processing unit is provided in each of the battery state detection devices.

3. The battery monitoring apparatus according to claim 2, wherein:
   the processing unit transmits the identification information to the control device with respect to the battery state detection devices to which identification information is to be given; and
   the control device stores the identification information.

4. The battery monitoring apparatus according to claim 1, further comprising:
   a storage unit configured to store a table indicating a relationship between the wireless communication strengths and the identification information,
   wherein the processing unit determines the identification information, which is to be given to the battery state detection devices to which identification information is to be given, based on the table.

5. The battery monitoring apparatus according to claim 2, further comprising:
   a storage unit configured to store a table indicating a relationship between the wireless communication strengths and the identification information,
   wherein the processing unit determines the identification information, which is to be given to the battery state detection devices to which identification information is to be given, based on the table.

6. The battery monitoring apparatus according to claim 3, further comprising:

a storage unit configured to store a table indicating a relationship between the wireless communication strengths and the identification information, wherein the processing unit determines the identification information, which is to be given to the battery state detection devices to which identification information is to be given, based on the table.

7. An identification information giving method of detecting states of battery modules and giving an identification information to battery state detection devices wirelessly connectable to a control device, the identification information giving method comprising:

giving, to the battery state detection devices to which the identification information is to be given, the identification information indicating arrangement positions of the battery state detection devices based on a plurality of wireless communication strengths among wireless communication strengths between the battery state detection devices to which the identification information is to be given and other battery state detection devices, and wireless communication strengths between the battery state detection devices to which the identification information is to be given and the control device;

searching, by the control device, for the battery state detection devices, which are wirelessly connectable, based on a unique information stored in each of the battery state detection devices;

transmitting, by the control device, a transmission instruction signal of a reception strength determination signal to the found battery state detection devices;

transmitting, by the battery state detection devices, the reception strength determination signal to other battery state detection devices based on the transmission instruction signal;

obtaining, by a processing unit, wireless communication strengths between the battery state detection devices to which identification information is to be given and the control device based on a reception strength of the transmission instruction signal;

obtaining, by the processing unit, wireless communication strengths between the battery state detection devices to which identification information is to be given and the other battery state detection devices based on the reception strength of the reception strength determination signal, and giving, by the processing unit, the identification information to the battery state detection devices to which identification information is to be given based on the obtained wireless communication strengths.

* * * * *